(12) United States Patent
Zundel et al.

(10) Patent No.: US 7,936,010 B2
(45) Date of Patent: May 3, 2011

(54) POWER SEMICONDUCTOR HAVING A LIGHTLY DOPED DRIFT AND BUFFER LAYER

(75) Inventors: Markus Zundel, Egmating (DE); Franz Hirler, Isen (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/342,721

(22) Filed: Dec. 23, 2008

(65) Prior Publication Data

US 2009/0166727 A1 Jul. 2, 2009

Related U.S. Application Data

(63) Continuation-in-part of application No. 11/965,387, filed on Dec. 27, 2007, now abandoned.

(51) Int. Cl.
*H01L 29/78* (2006.01)

(52) U.S. Cl. ........ 257/330; 257/328; 257/329; 257/331; 257/332; 257/335; 257/339; 257/341; 257/342; 257/401; 257/502; 257/E21.41; 257/E21.418; 257/E29.257; 257/E29.262

(58) Field of Classification Search .................. 257/330, 257/335, 329, E29.257, E21.41, 401, 341, 257/342, 328, 331, 332, 339, 502, E21.418, E29.262, 500

See application file for complete search history.

(56) References Cited

U.S. PATENT DOCUMENTS

| | | | | |
|---|---|---|---|---|
| 4,941,026 A | * | 7/1990 | Temple | 257/333 |
| 2005/0045922 A1 | * | 3/2005 | Ahlers et al. | 257/242 |

FOREIGN PATENT DOCUMENTS

| | | | |
|---|---|---|---|
| DE | 10245091 A1 | * | 4/2004 |
| DE | 10245091 | | 9/2004 |

* cited by examiner

*Primary Examiner* — Fernando L Toledo
*Assistant Examiner* — John P Dulka
(74) *Attorney, Agent, or Firm* — Dicke, Billig & Czaja, PLLC

(57) ABSTRACT

A power semiconductor element having a lightly doped drift and buffer layer is disclosed. One embodiment has, underneath and between deep well regions of a first conductivity type, a lightly doped drift and buffer layer of a second conductivity type. The drift and buffer layer has a minimum vertical extension between a drain contact layer on the adjacent surface of a semiconductor substrate and the bottom of the deepest well region which is at least equal to a minimum lateral distance between the deep well regions. The vertical extension can also be determined such that a total amount of dopant per unit area in the drift and buffer layer is larger than a breakdown charge amount at breakdown voltage.

6 Claims, 1 Drawing Sheet

POWER SEMICONDUCTOR HAVING A LIGHTLY DOPED DRIFT AND BUFFER LAYER

CROSS-REFERENCE TO RELATED APPLICATIONS

This Utility patent application is a Continuation-in-Part of U.S. application Ser. No. 11/965,387, filed Dec. 27, 2007, which is herewith incorporated in its entirety by reference.

BACKGROUND

The invention relates to a power semiconductor element, in particular to a power MOS transistor of the planar type or a power transistor of the trench type.

In the course of the development of new generations of DMOS power transistors, the reduction of the specific On-resistance $R_{on}$. A is an important objective. Reducing the value of this parameter results in minimizing of the static power loss, whereas higher current densities may be achieved. Both effects make it possible to use smaller and cheaper semiconductor elements or chips, respectively, for controlling a total current of a predetermined level. Another parameter of such semiconductor element is a high resistivity against avalanche breakdown in the blocking or reverse operation mode of the element.

Prior developments in this field had frequently the unsatisfactory result that some progress in optimizing the one of the important parameters could be achieved, whereas at the same time the other important parameter could not be maintained at a favourable level.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
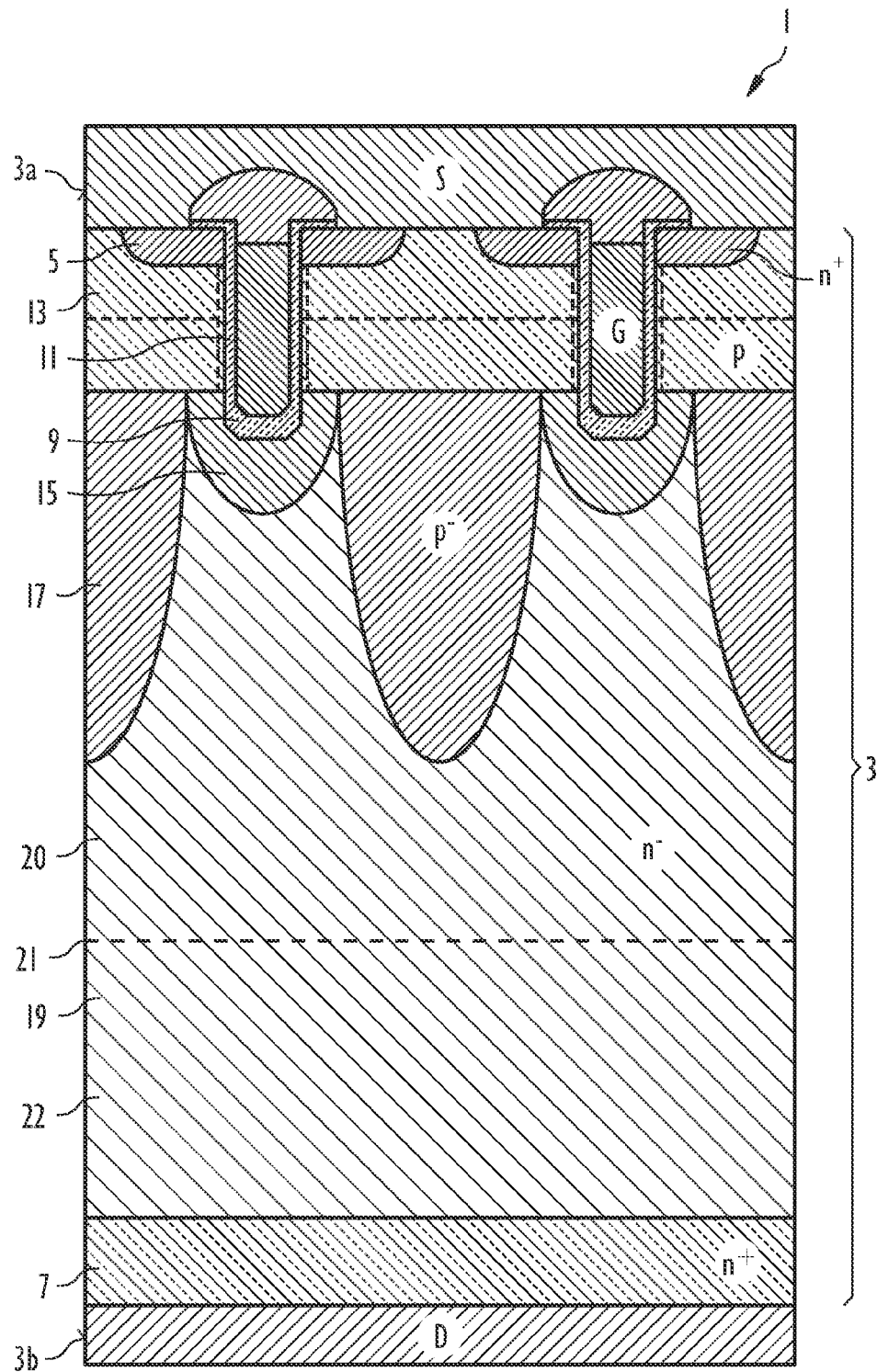
FIG. 1 illustrates a schematic representation of an exemplary embodiment, as a cross-sectional representation of a first power semiconductor element structure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(S) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a power semiconductor element which is made in a semiconductor substrate and includes a semiconductor body having a first and a second surface, being of a first conductivity type and having a first dopant concentration, formed in the first surface. A contact arrangement is provided in or on the first surface, and at least two deep, lightly doped well regions of the first conductivity type having a second, lower dopant concentration are provided near the first surface and have a minimum lateral distance therebetween. A highly doped drain contact layer of a second conductivity type and a first dopant concentration is provided in or on the second surface and an electrode is provided on the free surface of the drain contact layer.

In this semiconductor element, underneath and between the deep well regions of the first conductivity type a lightly doped drift and buffer layer of the second conductivity type and of a second dopant concentration is provided, wherein the drift and buffer layer has a minimum vertical extension (dimension) between the drain contact layer and the bottom of the deepest well region which is at least equal to a minimum lateral distance between the deep well region.

In one or more embodiments, the idea of providing a trench cell structure as a means to arrive at a significant reduction of the channel resistance, as a result of a significant increase of the channel width per unit area, is used. On the other hand, the inventors have dealt with the possible problem of a decrease of the blocking or reverse voltage already at moderate current densities, with the danger of a destruction of the semiconductor element, by providing an additional voltage buffer zone for the high current avalanche mode.

In other words a safety zone underneath the trenches is proposed, this safety zone serving as an extension zone for the dynamic extension of a space-charge region in a high current density avalanche case. In such case, in a drift zone a high density of holes will be established and this presence of a large amount of positive charges increases an already existing positive epi background charge within the drift zone. As a result thereof, the distribution of the electrical field through the drift zone is dynamically changed, insofar as in this situation the maximum of the field strength is approximately in the region of a trench bottom, whereas the original field's strength maximum is decreased. As a result thereof, the achievable blocking voltage decreases, and a negative differential breakdown voltage characteristic will be established. Then, in that cell of a semiconductor cell or array where this effect first occurs, most of the resulting avalanche current is concentrated and this portion of the array may be thermicaly destroyed due to an unduly large current density. The invention, however, aims at adequate means for depleting addition charges, and, therefore, providing an additional region of maximum electrical field strength, contributing to a higher achievable total blocking or reverse voltage.

Whereas the above explained negative effects of the prior art in semiconductor elements of low reverse voltage (below typically 40 V) do rarely occur, embodiments herein are, for example, in power semiconductor elements of higher reverse voltage classes, in particular in the range of 40 V to 1200 V.

In one embodiment, the above mentioned vertical extension of the drift and buffer layer amounts to at least twice the minimum lateral distance between the deep well regions. The exact extension is dependent on the specific element structure, wherein it may be a helpful design rule to consider that the "safety zone" should have a thickness which is not completely depleted by the space-charge region at low current densities.

In a further embodiment, the second dopant concentration is constant through the drift and buffer layer. In one or more embodiments, under certain circumstances it may be useful if the second dopant concentration in the drift and buffer layer increases towards the drain contact layer. Even in this regard, specific design rules, in accordance with the above explained physical effects, are dependent on the predetermined device parameters and design features.

In a further embodiment, underneath and between the deep well regions of the first conductivity type a lightly doped drift and buffer layer of the second conductivity type and a second dopant concentration is provided, the minimum vertical extension of the drift and buffer layer between the drain contact layer and the bottom of the deepest well region being determined such that a total amount of its dopants per unit area is larger than a breakdown charge amount at breakdown voltage.

Herein, the term "breakdown charge amount" means the charge amount which may be depleted by a pn junction before the avalanche factor 1 is reached. This charge is dependent on the dopant concentration, typical values are about $2\text{-}3\cdot10^{12}$ cm$^{-2}$.

In a design option of this embodiment, the vertical extension of the drift and buffer layer is determined such that the total amount of the dopants per unit area is within the range of the 1.5-2.5 fold charge at breakdown voltage.

In a further embodiment, the second dopant concentration is constant through the drift and buffer layer. Once again, in one embodiment the second dopant concentration in the drift and buffer layer may increase towards the drain contact layer, i.e. towards the second main surface of the substrate.

In both above explained basic embodiments, a technology is useful wherein the semiconductor body and the drift and buffer layer include a semiconductor substrate and the drain contact layer includes an ion implantation layer within the semiconductor substrate.

To enhance the advantages of the physical effects explained above, a further embodiment may be useful wherein an interface between the drift and buffer layer and the drain contact layer includes valleys under the (in a cross-section more or less U or V shaped) deep well regions. In this regard, the interface between the "safety zone" and the drain contact layer may be undulated.

In a further embodiment of the invention, the dopant concentration of the drift zone beneath the deep wells may either be significantly decreased (down to a factor of 0.01) or, increased (e.g., up to a factor 3), as compared to the dopant concentration between the deep well regions.

As an important embodiment, a power MOS transistor of the planar type is provided including a semiconductor body having a first and a second surface and body regions of a first conductivity type and having a first dopant concentration, formed in the first surface. At its first surface, this planar transistor has a highly doped source region of the second conductivity type having a first dopant concentration; as well as a contact arrangement including a gate electrode over an insulating layer on the first surface and source electrode, directly over the first surface and in contact with the source region.

Similar to the semiconductor element explained above, this transistor has at least two deep, lightly doped well regions of the first conductivity type having a second dopant concentration, and having a minimum lateral distance therebetween, a highly doped drain contact layer of the second conductivity type and a second dopant concentration provided in or on the second surface of the semiconductor base layer, and an electrode provided on the free surface of the drain contact layer.

As in the element explained above, underneath and between the deep well regions of the first conductivity type a lightly doped drift and buffer layer of the second conductivity type and a third dopant concentration is provided, wherein the drift and buffer layer has a minimum vertical extension between the drain contact layer and the bottom of the deepest well region which is at least equal to the minimum lateral distance between the deep well region.

In a further embodiment, the vertical dimension of the drift and buffer layer between the drain contact layer and the bottom of the deepest well region is determined such that a total amount of its dopants per unit area is larger than a breakdown charge amount at breakdown voltage. Incidentally, the latter design rule may be combined with the former rule, making the vertical extension of the "safety zone" dependent on the minimum lateral distance between the deep well regions above it.

According to a further embodiment, a power transistor of the trench type is provided. Whereas most of the structural components or portions, respectively, of this transistor are similar to those of the planar type, as described further above, this transistor includes a gate electrode provided within a trench extending vertically into the first surface of the semiconductor body and being separated from the walls of the trench by an insulating layer. Even in this transistor, in accordance with an embodiment of the invention, a lightly doped drift and buffer layer or safety zone, respectively, is provided underneath and between the deep well regions of the opposite conductivity type, and this combined layer or zone has a minimum vertical extension which is at least equal to the minimum lateral distance between the deep well regions.

According to a further embodiment, the vertical extension of this layer or zone is determined such that a total amount of its dopants per unit area is larger than a break down charge amount at break down voltage. Similar as in the above explained semiconductor elements, both design rules to determine a useful extension of the "safety zone" may be combined.

Even in the trench type embodiment of the invention, the dopant concentration of the drift and buffer layer may be constant through the entire thickness of this combined layer, or it may increase towards the adjacent drain contact layer.

According to any of the above embodiments, the deep lightly doped well regions need not necessarily be continuous regions. In a further embodiment of the invention, each of them may be constituted by a basically vertical stack of separated, bubble-shaped well regions.

In the various embodiments, the "first conductivity type" may, in particular, be the p type, whereas in such case the "second conductivity type" is the n type, both types in general covering all technically reasonable dopant concentrations, i.e. p$^-$ to p$^+$ ranges or n$^-$ to n$^+$ ranges, respectively. In one embodiment, in semiconductor elements of the respective reverse type the first conductivity type may be the n type, whereas the second conductivity type is the p type.

The FIGURE schematically illustrates a cross-sectional structure of a power MOS transistor 1 of the trench type including a semiconductor substrate 3 with first and second main surfaces 3a, 3b. On the first main surface 3a, a source contact layer S is provided to connect source regions 5, whereas at the second main surface 3b a planar drain contact layer D is provided on a likewise planar drain layer 7. Gate electrodes G are provided in trenches 9, each of the gate electrodes being isolated with respect to the semiconductor material by using insulating side wall layers 11 within the respective trench 9. The general structure of the element is known and will, therefore, not be described in more detail. In particular, the layer structure including several differently doped semiconductor layers is schematically illustrated, the respective conductivity type being designated with the typical numerals "p" or "p$^-$" or "n$^-$" or "n$^+$", respectively.

With regard to the present invention, it should be mentioned that underneath a p body layer 13, adjacent to the source contact layer S, an arrangement of alternating shallow and deep n-type well regions 15 and p-type well regions 17 is provided within the substrate.

The lightly doped (n$^-$) region between the deeper wells and underneath all of the wells provides for a buffer or safety zone 19 having the above explained effects on the space-charge behaviour in the high current avalanche situation. Thereby, the zone 20 shown in FIG. 1 refers to a space-charge region, which forms at low current densities in an upper portion of the buffer or safety zone 19. The zone 20 is also referred to as a drift layer whereas the zone below the border 21 of the space-charge region is referred to as a buffer layer 22. For this zone or region 19, the above mentioned rules to determine the vertical extension or dimension are valid.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power MOS transistor of the planar type, comprising:
   a semiconductor body having a first and a second surface,
   body regions of a first conductivity type and a first dopant concentration formed in the first surface;
   a highly doped source region of a second conductivity type having a first dopant concentration, provided at the first surface;
   a contact arrangement provided at the first surface, the contact arrangement comprising a gate electrode over an insulating layer on the first surface and source electrode, directly over the first surface and in contact with the source region;
   at least two deep, lightly doped well regions of the first conductivity type having a second dopant concentration, and having a minimum lateral distance therebetween;
   a highly doped drain contact layer of the second conductivity type and a second dopant concentration provided in or on the second surface of the semiconductor body; and
   an electrode provided on the free surface of the drain contact layer;
   wherein underneath and between the deep well regions of the first conductivity type a lightly doped drift and buffer layer of the second conductivity type and a third dopant concentration is provided, wherein the drift and buffer layer has a minimum vertical extension between the drain contact layer and the bottom of the deepest well region which is at least equal to the minimum lateral distance between the deep well regions
   wherein the vertical extension of the drift and buffer layer amounts to at least twice the minimum lateral distance between the deep well regions; and
   wherein the vertical extension of the drift and buffer layer between the drain contact layer and the bottom of the deepest well region is determined such that a total amount of its dopants per unit area is larger than a breakdown charge amount.

2. The power transistor of claim 1, wherein the second dopant concentration in the drift and buffer layer increases towards the drain contact layer.

3. The power transistor of claim 1, of the superjunction type, wherein the deep, lightly doped well regions are constituted by a basically vertical stack of separated, bubble-shaped well regions.

4. The power transistor of claim 1, wherein the semiconductor body and the drift and buffer layer comprise a semiconductor substrate and the drain contact layer comprises an ion implantation layer within the semiconductor substrate.

5. The power transistor of claim 1, wherein the second dopant concentration is constant through the drift and buffer layer.

6. The power transistor of claim 1, wherein an interface between the drift and buffer layer and the drain contact layer comprises valleys under the deep well regions.

* * * * *